(12) United States Patent
Lee et al.

(10) Patent No.: US 9,831,336 B2
(45) Date of Patent: Nov. 28, 2017

(54) PROCESS FOR FORMING A SHORT CHANNEL TRENCH MOSFET AND DEVICE FORMED THEREBY

(71) Applicant: Vishay-Siliconix, Santa Clara, CA (US)

(72) Inventors: Zachary Lee, Lake Forest, CA (US); Deva Pattanayak, Saratoga, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 14/537,760

(22) Filed: Nov. 10, 2014

(65) Prior Publication Data

US 2015/0061000 A1 Mar. 5, 2015

Related U.S. Application Data

(62) Division of application No. 11/710,041, filed on Feb. 23, 2007, now Pat. No. 8,883,595.

(60) Provisional application No. 60/776,771, filed on Feb. 23, 2006.

(51) Int. Cl.

| H01L 29/78 | (2006.01) |
| H01L 21/265 | (2006.01) |
| H01L 29/08 | (2006.01) |
| H01L 29/10 | (2006.01) |
| H01L 29/66 | (2006.01) |
| H01L 29/423 | (2006.01) |

(52) U.S. Cl.
CPC .... *H01L 29/7813* (2013.01); *H01L 21/26513* (2013.01); *H01L 21/26586* (2013.01); *H01L 29/0878* (2013.01); *H01L 29/1095* (2013.01); *H01L 29/4236* (2013.01); *H01L 29/66734* (2013.01)

(58) Field of Classification Search
CPC ............. H01L 29/7813; H01L 29/7834; H01L 29/0847; H01L 29/66621; H01L 29/7827
USPC .......................... 257/329, 330, 331, 341, 342
See application file for complete search history.

(56) References Cited

U.S. PATENT DOCUMENTS

| 5,341,011 A * | 8/1994 | Hshieh | ................ H01L 29/7813 257/330 |
| 5,558,313 A * | 9/1996 | Hshieh et al. | ................. 257/342 |
| 5,929,481 A * | 7/1999 | Hshieh | ................ H01L 29/0878 257/328 |

(Continued)

FOREIGN PATENT DOCUMENTS

| DE | 10329163 | 3/2004 |
| EP | 1536463 | 1/2005 |
| JP | 2001036079 | 2/2001 |

OTHER PUBLICATIONS

Timothy Henson, Espacenet Bibliographic Data: Abstract of DE10329163 A1, Mar. 4, 2004, 1 page, European Patent Office, http://worldwide.espacenet.com.

(Continued)

*Primary Examiner* — Jonathan Han
*Assistant Examiner* — David Vu

(57) ABSTRACT

A process for forming a short channel trench MOSFET. The process includes forming a first implant at the bottom of a trench that is formed in the body of the trench MOSFET and forming a second or angled implant that is tilted in its orientation and directed perpendicular to the trench that is formed in the body of the trench MOSFET. The second implant is adjusted so that it does not reach the bottom of the trench. In one embodiment the angled implant is n-type material.

20 Claims, 7 Drawing Sheets

(56) References Cited

U.S. PATENT DOCUMENTS

| | | | |
|---|---|---|---|
| 6,051,488 A * | 4/2000 | Lee | H01L 21/8234 257/330 |
| 6,191,446 B1 | 2/2001 | Gardner et al. | |
| 6,329,253 B1 | 12/2001 | Song et al. | |
| 6,461,900 B1 | 10/2002 | Sundaresan et al. | |
| 6,461,918 B1 | 10/2002 | Calafut | |
| 6,498,108 B2 | 12/2002 | Cao et al. | |
| 6,518,621 B1 | 2/2003 | Hshieh et al. | |
| 6,534,825 B2 | 3/2003 | Calafut | |
| 6,545,315 B2 | 4/2003 | Hshieh et al. | |
| 6,551,909 B1 | 4/2003 | Fujihira | |
| 6,624,469 B1 | 9/2003 | Harada | |
| 6,713,352 B2 | 3/2004 | Hshieh et al. | |
| 7,135,738 B2 | 11/2006 | Williams et al. | |
| 2004/0065920 A1 | 4/2004 | Henson | |
| 2004/0178457 A1 | 9/2004 | Francis et al. | |
| 2004/0183124 A1 | 9/2004 | Hsu et al. | |
| 2004/0222457 A1 * | 11/2004 | Kim | H01L 29/105 257/328 |
| 2004/0256665 A1 * | 12/2004 | Birner et al. | 257/329 |
| 2005/0001264 A1 | 1/2005 | Ono et al. | |
| 2005/0029586 A1 | 2/2005 | Ono et al. | |
| 2005/0032287 A1 | 2/2005 | Nakazawa et al. | |

OTHER PUBLICATIONS

Fujiwara Ijuo, et al., INPIT Patent Abstracts of Japan: Abstract of JP2001-036079, Feb. 9, 2001, 2 pages, Japan Patent Office, Japan.

* cited by examiner

PROCESS FOR FORMING A SHORT CHANNEL TRENCH MOSFET AND DEVICE FORMED THEREBY

CROSS-REFERENCE TO RELATED APPLICATIONS

This application is a divisional of U.S. patent application Ser. No. 11/710,041, filed on Feb. 23, 2007, entitled "PROCESS FOR FORMING A SHORT CHANNEL TRENCH MOSFET AND DEVICE FORMED THEREBY," which claims benefit of U.S. provisional patent application Ser. No. 60/776,771, filed Feb. 23, 2006, which are hereby incorporated herein by reference in their entirety.

TECHNICAL FIELD

Embodiments of the invention pertain to methods for forming short-channel trench MOSFETs.

BACKGROUND ART

Metal Oxide Semiconductor Field Effect transistors (MOSFETs) are common transistors used in digital and analog circuits. MOSFETs include a channel of n-type or p-type semiconductor material through which current flows. MOSFETs that are fabricated to include channels of n-type semiconductor material are called NMOSFETs and MOSFETs that are fabricated to include channels of p-type semiconductor material are called PMOSFETs. MOSFET types include planar MOSFETs and trench MOSFETs. Trench MOSFETs have facilitated an increase in attainable circuit density because of their small cell pitch as compared to planar MOSFETs.

The current that flows through the MOSFET, e.g., through the channel from drain to source (or vice versa), may be influenced by factors that include the physical design of the MOSFET. More specifically, aspects of the physical design such as the length of the MOSFET channel help to determine current related parameters such as the conductance and the resistance of the MOSFET channel (the resistance of the MOSFET is controlled by the channel after the MOSFET turns on). Importantly, these parameters are critical to the performance of the MOSFET as measured by the speed of operation and the power dissipation of the device. It should be appreciated that low channel resistance (such as is provided by shorter channel lengths) reduces power dissipation and increases device efficiency.

Conventional approaches to improving MOSFET performance include efforts to shorten the length of the MOSFET channel. The channel dimensions of a MOSFET may be defined by its junctions (e.g., interfaces between n-type and p-type regions) which may be established by the diffusion of impurities into the body of the device. Characteristics of the diffusion such as the depth of the diffusion help to establish the length of the channel. In fact, in some conventional processes the depth of diffusion alone may determine the length of the channel. In other conventional processes, the depth of the MOSFET trench may be a factor in determining the length of the channel.

It should be appreciated that in some cases the depth of diffusion and thus the length of the MOSFET channel may be controlled through appropriate management of implant energy and temperature. However, at small distances problems may arise as material variation may have a heightened impact on diffusion characteristics. And, as diffusion characteristics become more difficult to manage, the establishment of channel length becomes more difficult to control through diffusion.

In other conventional approaches attempts have been made to reduce channel length beyond that which is attainable through diffusion alone. In one such approach MOSFET trench depth has been used to achieve very short channel lengths. However, in such cases the relationship of the depth of the MOSFET trench to the depth of the p type regions formed in the body of the MOSFET structure (e.g., such as the contact implant, the contact clamping implant and body implant) needs to be carefully managed. Importantly, where the trench bottom is shallower or comparable in depth to the p-type regions formed in the MOSFET body then significant pinching may occur.

FIG. 1A shows a conventional trench MOSFET 100. When the gate 103 to source 101 voltage (e.g., Vgs) of MOSFET 100 is greater than a threshold voltage, then current flows in MOSFET 100 from drain 105 to source 101. In order to scale the devices to shorter channel-lengths and shallower trench depths, the trench-bottom implant, in which an n-type dopant (for n-channel devices) is implanted at the trench bottom so as to compensate for the p-type body implant and defining the channel bottom, had been found to provide very short channel lengths. Since this implant is self-aligned to the trench bottom, the channel-length is determined by the trench depth.

It should be appreciated that p-type body implant 107 may move so as to cover the bottom of trench 103 as is shown in FIG. 1B (see dashed line). Such covering of the bottom of trench 103 or "pinching" may substantially increase the resistance (e.g., rdson) of the channel of MOSFET 100 and may significantly degrade the MOSFETs performance. In other words, significant pinching occurs at trench depths such that the trench bottom is shallower as comparable in depth to the p-type region defined by the contact and contact-clamping implants, resulting in high rdson. Conventional techniques that facilitate the attainment of short channel lengths that are defined through the use of trenches do not include measures that effectively address such pinching that may occur at very short trench depths.

SUMMARY OF THE INVENTION

Accordingly, a need exists for an effective means of preventing pinching at short channel lengths where channel length is defined by the MOSFET trench depth. Embodiments of the present invention provide a process that accomplishes the above-mentioned need.

For instance, in one embodiment, an anti-pinching implant and a trench-bottom implant combination may be used to facilitate short MOSFET channel lengths that feature correspondingly low resistances to current flow through the channel. In one embodiment, the anti-pinching implant prevents pinch-off and the trench bottom implant defines the bottom of the MOSFET channel. Accordingly, the anti-pinching implant and trench-bottom implant combination enables pinch-off free transistor operation at extremely short MOSFET trench depths and channel lengths.

In one embodiment, the process for forming the short channel trench MOSFET includes performing a first implant at the bottom of a trench that is formed in the body of the trench MOSFET and performing a second implant that is tilted e.g., angled, in its orientation and directed perpendicular to the trench that is formed in the body of the trench MOSFET. The second implant is adjusted so that it does not reach the bottom of the trench. In one embodiment, the second implant is an angle implant of n-type. In one embodiment, the angle implant is directed through the contact window. In other embodiments, the resulting MOSFET has a thick bottom oxide short channel and may have a low doped epitaxial layer. In other embodiments, the resulting MOSFET has a thick bottom oxide short channel and may have a low doped epitaxial layer.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

It should be appreciated that in the discussion to follow the term rdson is intended to refer to the drain to source "on" resistance, Qg is intended to refer to the gate charge and Qgd is intended to refer to the gate to drain charge. In addition, although an embodiment of the invention has been described with reference to an NMOSFET structure the principles that are disclosed herein are equally applicable to PMOSFET devices.

Figure 1A:
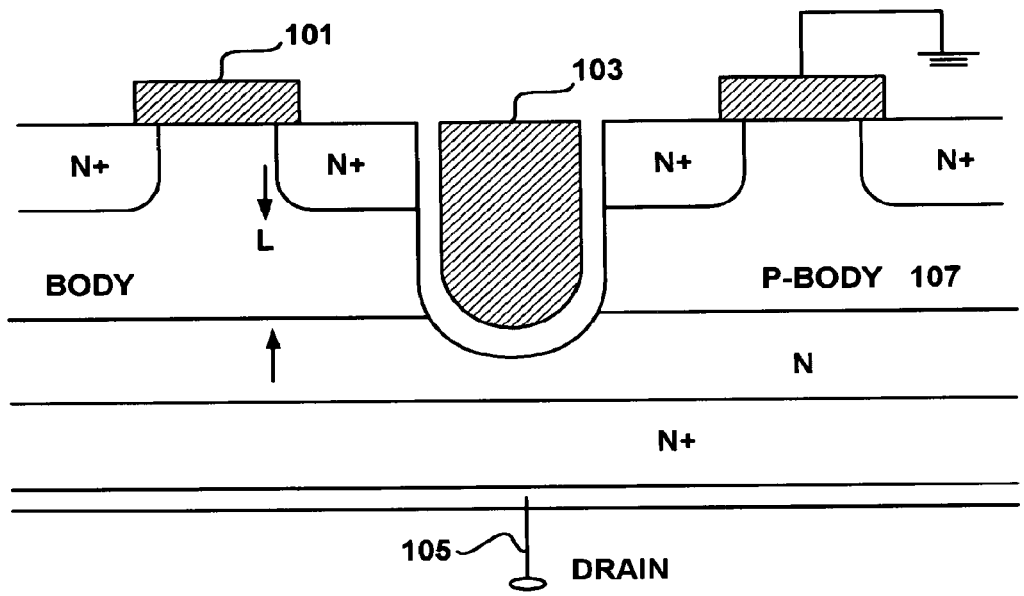
FIG. 1A shows a conventional trench MOSFET device.
Figure 1B:
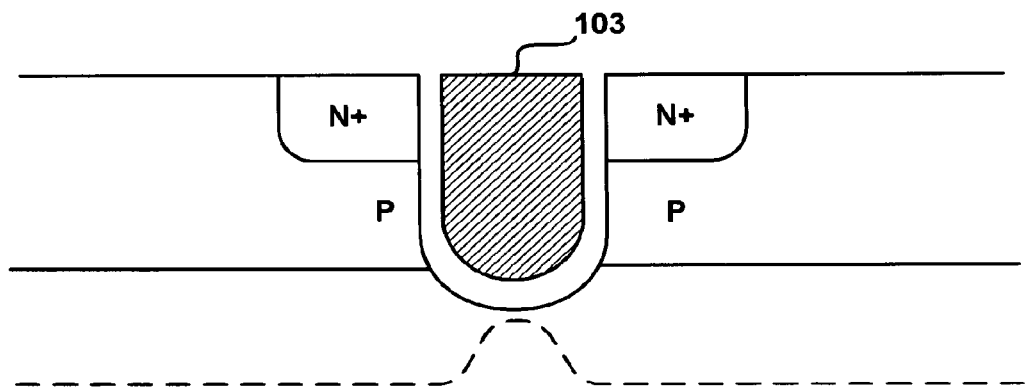
FIG. 1B illustrates pinching or the covering of the bottom of the trench with the p-body thereby increasing rdson.
Figure 2A:
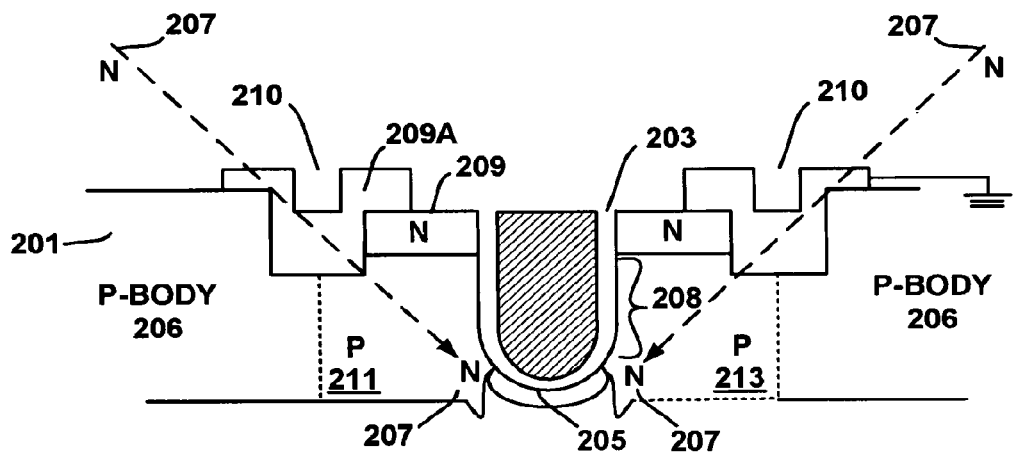
FIG. 2A shows elements of a short-channel trench MOSFET according to one embodiment of the present invention.

Short-Channel Trench MOSFET According to One Embodiment of the Present Invention FIG. 2A shows elements of a short-channel trench MOSFET device 200 according to one embodiment of the present invention. In one embodiment, an angled anti-pinching implant 207 and a trench-bottom implant 205 combination may be used to facilitate the ascertainment of short MOSFET channel lengths that feature correspondingly low resistances (rdson) to the flow of current. In one embodiment, anti-pinching implant 207 prevents pinch-off and trench bottom implant 205 defines the bottom of the MOSFET channel.

Accordingly, the anti-pinching implant 207 and trench-bottom implant 205 combination enables pinch-off free MOSFET operation at extremely short MOSFET trench depths and channel lengths. In the FIG. 2A embodiment, short-channel trench MOSFET 200 includes substrate 201, trench 203, trench bottom implant 205, p type body implant 206, anti-pinching implant 207, channel 208, contact 209, contact window 210, p type contact implant 211 and p type contact clamping implant 213.

Referring to FIG. 2A, trench 203 extends into the body of substrate 201. In one embodiment, a trench bottom implant (e.g., 205) may be formed at the bottom of trench 203. In one embodiment, trench bottom implant 205 serves to define channel 208 and compensate for p-type body implant 206 that may be formed in the body of substrate 201. In one embodiment, an n-type dopant may be used to form trench bottom implant 205. In one embodiment, trench bottom implant 205 may be self-aligned to the bottom of trench 203. In one embodiment, the formation of trench-bottom implant 205, which may or may not be tilted, may be performed before or after an isotropic phase of the etching of trench 203.

Figure 2B:
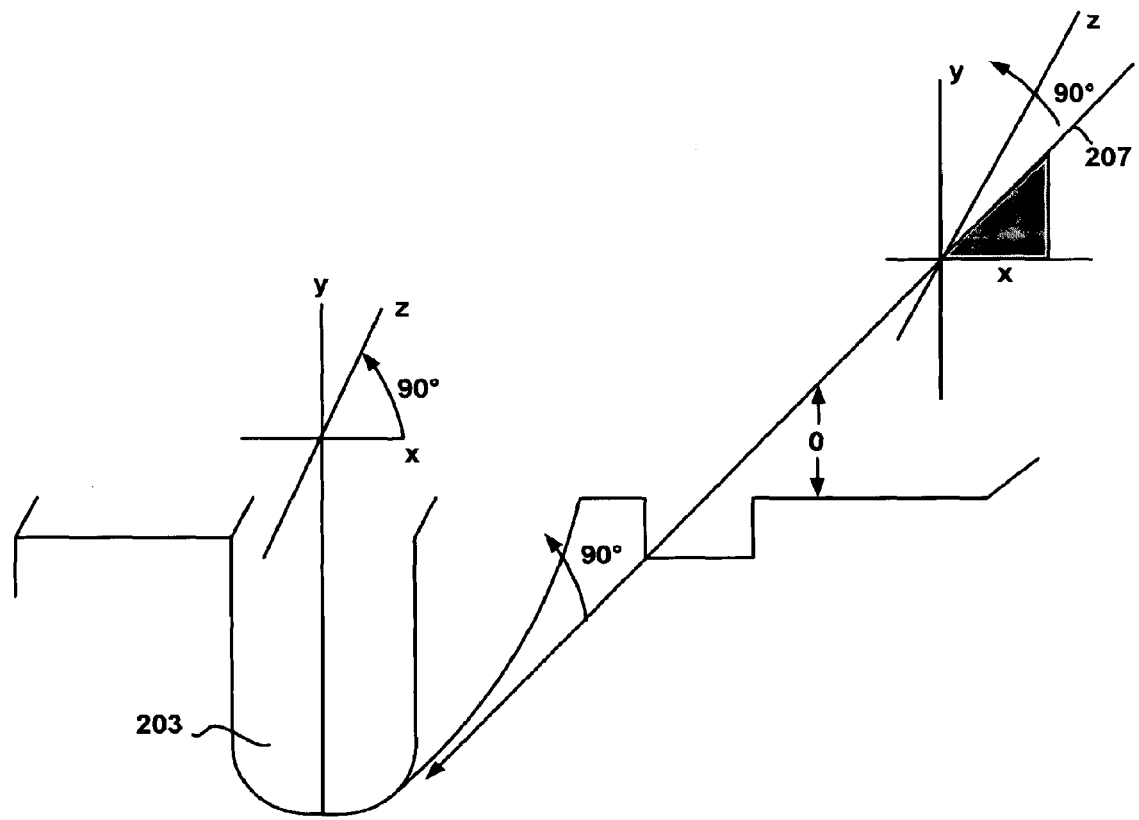
FIG. 2B illustrates an exemplary orientation of anti-pinching implant according to one embodiment of the present invention.

In one embodiment, angled anti-pinching implant 207 may be formed by implantation through contact windows 210 into substrate 201 using an n-type dopant that may be tilted in its orientation and adjusted so that it does not reach the bottom of trench 203. In one embodiment, this may be accomplished by adjusting the dose and the energy of anti-pinching implant 207. In one embodiment, anti-pinching implant 207 may be disposed perpendicularly to trench 203. FIG. 2B illustrates an exemplary orientation of anti-pinching implant 207 according to one embodiment of the present invention. More specifically, FIG. 2B illustrates the manner, according to one embodiment of the present invention, in which anti-pinching implant 207 may be tilted and disposed perpendicularly with respect to trench 203.

Referring again to FIG. 2A, it should be appreciated that in one embodiment, anti-pinching implant 207 operates to confine the p-type regions formed by contact implant 211 and contact-clamping implant 213 such that these regions remain shallow. It should be appreciated that the confinement of contact 211 and contact-clamping implant 213 prevents pinching that may occur near the bottom of trench 203 and that may be associated with contact implant 211 and contact clamping implant 213. Without the confinement action of the anti-pinching implant 207, contact implant 211 and contact-clamping implant 213 may extend deeper into the body of the MOSFET than the bottom of trench 203 (e.g., covering the trench bottom) which may result in a significant increase in channel 208 resistance (rdson).

In one embodiment, anti-pinching implant 207 may be formed after a contact etch is performed. In one embodiment, because anti-pinching implant 207 is formed so as not to reach the bottom of trench 203 an increase in Qgd that may be associated with an accumulation of n-type dopants near the bottom of trench 203 may be avoided.

In one embodiment, anti-pinching implant 207 enables a reduction in the implant dose used to form trench-bottom implant 205. This in turn results in a further reduction in Qgd (as it minimizes accumulation of n-type dopants near the bottom of trench 203). In one embodiment, the combination of trench-bottom implant 205 and anti-pinching implant 207 may provide a greater than 25% improvement in rdson2*Qgd and rdson2*Qg as compared to conventional 300M cell processes.

In one embodiment, anti-pinching implant 207 may be formed using 4e13 20 Kev phosphorous at 14-18 degree tilt and at two twist angles perpendicular to trench 203. In one embodiment, trench-bottom implant 205 may be formed using 9e11 40 KeV arsenic.

Figure 2C:
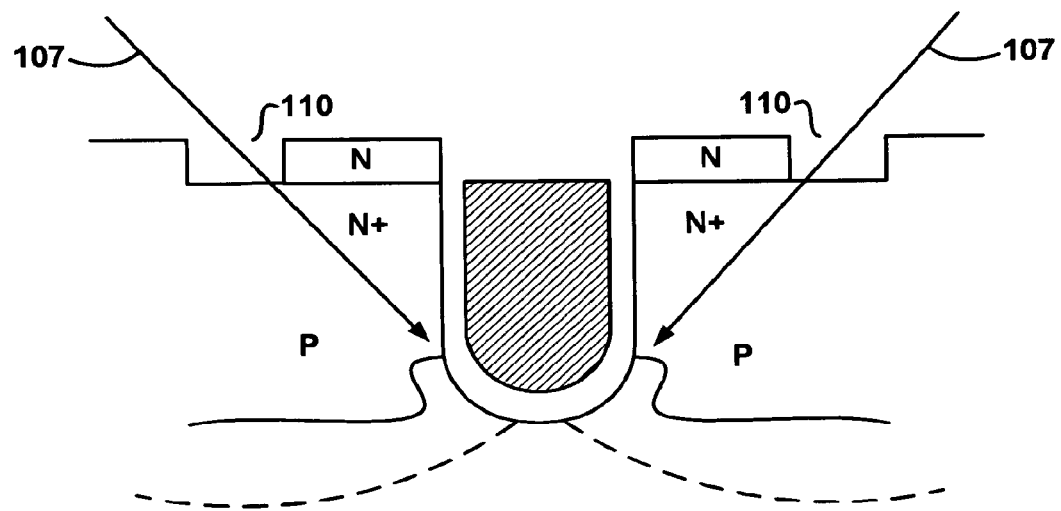
FIG. 2C illustrates the effect of the use of anti-pinching implant according to one embodiment of the present invention.

FIG. 2C illustrates the result of the use of anti-pinching implant 207 (a trench bottom implant is not shown in FIG. 2C). In FIG. 2C, the appearance of the p type region is shown during MOSFET operation. As shown, during MOSFET operation the p type region formed by p-body, contact and contact-clamping implant is prevented from covering the bottom of trench 203. The dashed line shows how the p-type region would appear during operation if anti-pinching implant 207 were not employed.

Exemplary embodiments of the present invention feature: (1) the use of a trench bottom implant, (2) the use of an anti-pinching implant that may be tilted and disposed perpendicularly with respect to trench, and (3) the use of low energies to form the body 206, source implant 209, contact implant 211, and contact-clamping implants 213.

Figure 3A:
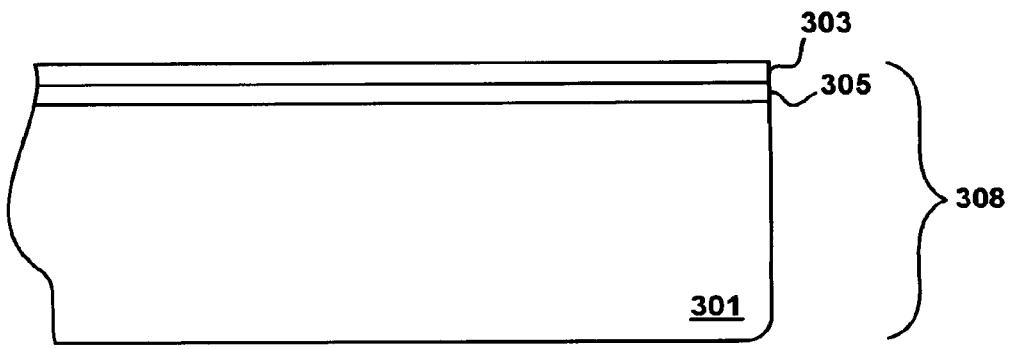
FIG. 3A illustrates a step in the formation of a short channel trench MOSFET according to one embodiment of the present invention.

FIGS. 3A-3E illustrate steps in the fabrication of a short channel trench MOSFET (e.g., 200 in FIG. 2A) according to one embodiment of the present invention. FIG. 3A shows substrate 301, epi1 303, and epi2 305. In one embodiment, these structures may be formed in the initial stages of the fabrication of the short channel trench MOSFET (e.g., 200 in FIG. 2A). In one embodiment, because the herein described trench bottom implant (e.g., 205 in FIG. 2A and 309 in FIG. 3C below) reduces the effective epi thickness, a higher voltage epi stack 308 than is generally used may be employed to achieve a desired breakdown voltage.

Figure 3B:
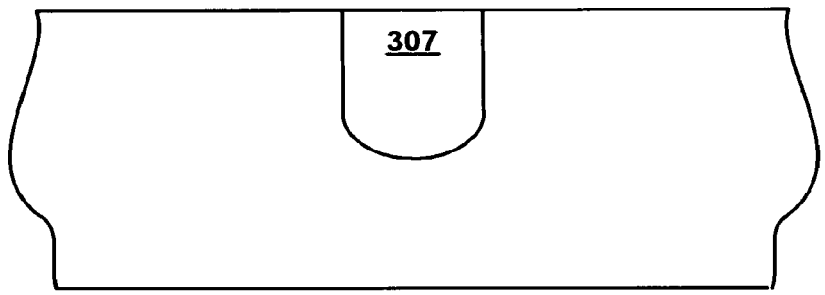
FIG. 3B illustrates a step in the formation of a short channel trench MOSFET according to one embodiment of the present invention.

FIG. 3B shows in addition to the structures discussed with reference to FIG. 3A, trench 307. In one embodiment, trench 307 may be formed at least partially by an isotropic etch. In the embodiment of FIGS. 3A-3E, the channel length of the resultant MOSFET may be defined by the trench depth (as determined by the depth of the trench etch). In one embodiment, the trench may be etched to a depth of around 0.6 µm. In alternate embodiments, other trench depths may be employed. In one embodiment, the width of trench 307 may be reduced as a means of improving Qgd/Qgs.

It should be appreciated that short trench depths may result in a susceptibility to significant pinching while larger trench depths may result in higher Qgd. In exemplary embodiments, the anti-pinching implant (e.g., 207 in FIG. 2A) described herein addresses these problems by preventing pinching and helping to lower Qgd.

In one embodiment, the depth of an isotropic sacrificial gate oxide etch may be chosen to be 0.075 µm to reduce electric field near the trench-bottom corner. In other embodiments, other isotropic sacrificial gate oxide etch depths may be employed as a means of reducing the electric field near the trench bottom corner.

Figure 3C:
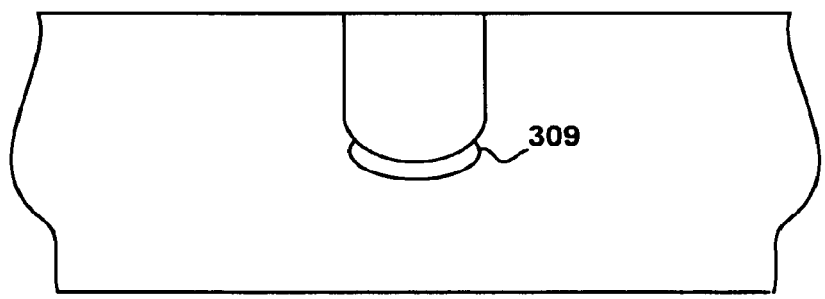
FIG. 3C illustrates a step in the formation of a short channel trench MOSFET according to one embodiment of the present invention.

FIG. 3C shows in addition to the structures discussed with reference to FIG. 3B, trench bottom implant 309. In one embodiment, trench bottom implant 309 may be formed subsequent to an isotropic portion of the trench etch and prior to a sacrificial oxidation operation. In one embodiment, trench bottom implant 309 serves to define the MOSFET channel and compensate for a p-type body implant (e.g., 206 in FIG. 2A and 315 in FIG. 3D below) that may be formed in the body of substrate 301. In one embodiment, an n-type dopant may be used to form trench bottom implant 309. In one embodiment, trench bottom implant 309 may be self-aligned to the bottom of trench 307.

In one embodiment, trench bottom implant 309 may be a low-dose and low-energy Arsenic implant of around 9e11 and 40 KeV. In other embodiments, other implant dopants, doses and energies may be used.

Figure 3D:
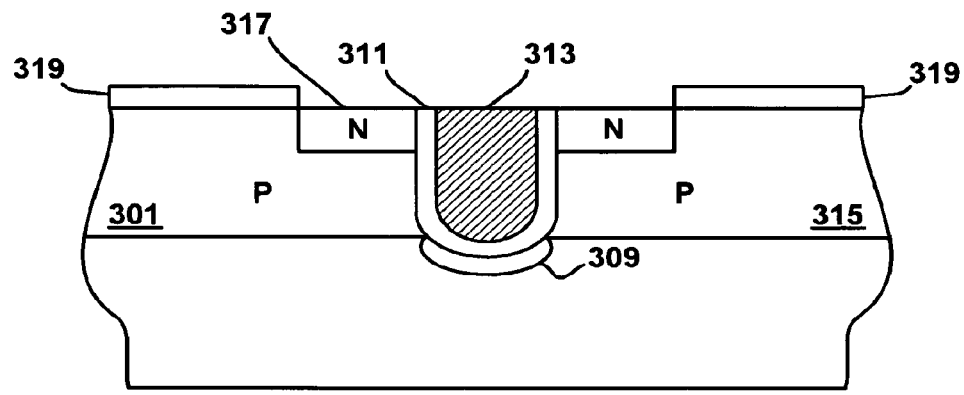
FIG. 3D illustrates a step in the formation of a short channel trench MOSFET according to one embodiment of the present invention.

FIG. 3D shows in addition to all of the structures discussed with reference to FIGS. 3A-3C, gate oxide 311, poly 313, p-type body implant 315, source implant 317 and boron phosphorous silicon glass (BPSG) 319. In one embodiment, gate oxide 311 may be a thick bottom oxide of 300 A or less. In other embodiments, gate oxide 311 may be a thick bottom oxide of other thicknesses.

Figure 3E:
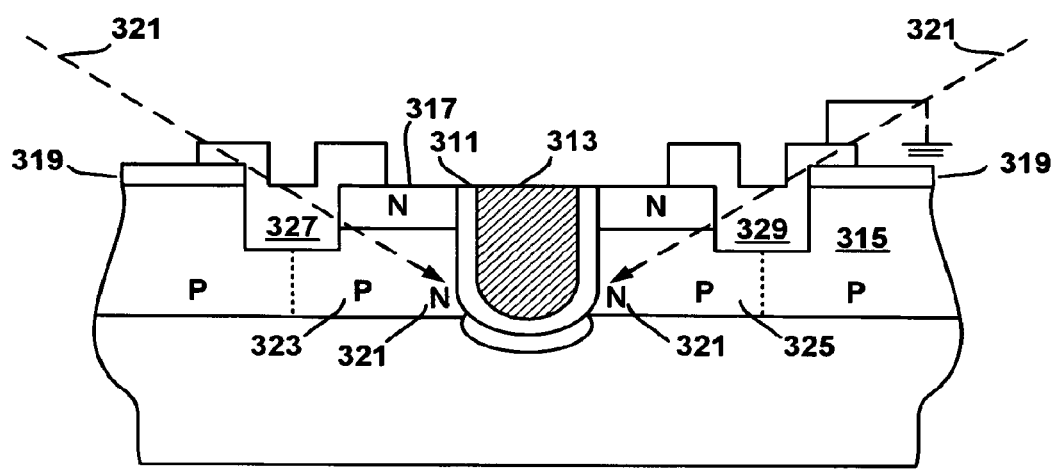
FIG. 3E illustrates a step in the formation of a short channel trench MOSFET according to one embodiment of the present invention.

FIG. 3E shows, in addition to all of the structures discussed with reference to FIGS. 3A-3D, anti-pinching implant 321, contact implant 323, contact clamping implant 325 and contact windows 327 and 329. In one embodiment, anti-pinching implant 321 may be formed in substrate 301 and may be tilted in its orientation and adjusted so that it does not reach the bottom of trench 307. In one embodiment, anti-pinching implant 321 may be implemented as an n-type dopant that is disposed perpendicularly to trench 307. In one embodiment, anti-pinching implant 321 acts to confine the p-type regions formed by contact implant 323 and contact-clamping implant 325. Consequently, the p-type implant region remains shallow and pinching near the bottom of the trench may be avoided (see discussion made with reference to FIG. 2C above).

In one embodiment, Phosphorous may be employed to implement anti-pinching implant 321. It should be appreciated that the anti-pinching implant 321 facilitates the use of a lower trench bottom implant 309 dose that contributes to the reduction Qgd.

In one embodiment, anti-pinching implant 321 may be implanted through the contact windows 327 and 329. In one embodiment, Qgd may be optimized at a contact depth of 4 um. In other embodiments, Qgd may be optimized at other contact depths. In one embodiment, a contact depth of 4 um allows the use of higher anti-pinching implant doses without increasing Qgd thus decreasing rdson. In other embodiments, other contact depths may allow the use of higher anti-pinching implant doses without increasing Qgd thus decreasing rdson.

In one embodiment, a maximum tilt angle that may be used is 18 degrees in order to avoid shadowing. In another embodiment, other tilt angles (14 degrees etc.) may be used in order to avoid shadowing. In one embodiment, the nominal implant may be 4 ev13/120 Kev (phosphorous) at 18 degrees tilt and two twist angles (perpendicular to the trench). In other embodiments, the nominal implant may involve different tilts and twist angles. It should be appreciated that, in one embodiment, two anti-pinching implants 321 at two twist angles may be employed for striped cell applications.

In one embodiment, contact-clamping implant 325 may be optimized in order to avoid or reduce pinching. In one embodiment, a dose of boron of 1e13 and 40 KeV energy may be employed to optimize contact-clamping implant 325 for avoidance or reduction of pinching. In other embodiments, other doses may be employed to optimize contact-clamping implant 325 for avoidance or reduction of pinching. In one embodiment, the low-energy contact implant 323 may be slightly reduced in energy.

Exemplary Process in Accordance with Embodiments of the Present Invention

Figure 4:
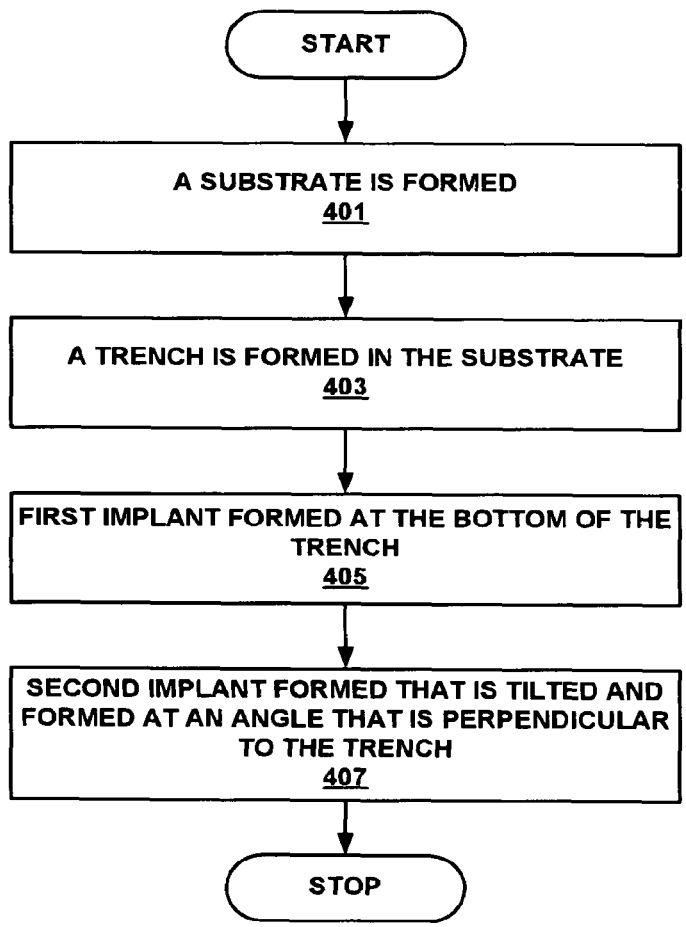
FIG. 4 is a flowchart of steps performed in a process for forming a short channel trench MOSFET in accordance with one embodiment of the present invention.

FIG. 4 is a flowchart 400 of steps performed in a process for forming a short channel trench MOSFET in accordance with one embodiment of the present invention. Although specific steps are disclosed in flowchart 400, such steps are only exemplary. That is, the present invention is well suited to performing various other steps or variations of the steps recited in FIG. 4.

At step 401, a substrate is formed, and at step 403, a trench is formed in the substrate. Subsequently, at step 405, a first implant is formed at the bottom (203 in FIG. 2A) of the trench MOSFET (e.g., 200 in FIG. 2A) being fabricated. In one embodiment, the first implant may be a trench bottom implant (e.g., 205 FIG. 2A). In one embodiment, the trench bottom implant (e.g., 205 FIG. 2A) serves to define the MOSFET channel (e.g., 208 in FIG. 2A) and to compensate for a p-type body implant (e.g., 206 in FIG. 2A) that may be formed in the body of substrate (e.g., 201 in FIG. 2A).

At step 407, a second implant is formed that is tilted in its orientation and directed perpendicularly to the MOSFET trench. The second implant may be adjusted so that it does not reach the bottom of the MOSFET trench. In one embodiment the second implant may be an anti-pinching implant (e.g., 207 in FIG. 2A). It should be appreciated that in one embodiment, the anti-pinching implant (e.g., 207 in FIG. 2A) may be used to confine p-type regions formed by a contact implant (e.g., 211 in FIG. 2A) and a contact-clamping implant (e.g., 213 in FIG. 2A). It should be appreciated that the confinement of the contact (e.g., 211 in FIG. 2A) and the contact-clamping implant (e.g., 213 in FIG. 2A) prevents pinching that may occur near the bottom of the MOSFET trench (e.g., 203 in FIG. 2A) and that may be associated with the contact implant (e.g., 211 in FIG. 2A) and the contact clamping implant (e.g., 213 in FIG. 2A).

In one embodiment, the doping profile of exemplary embodiments may include doping levels that may be at a minimum at the edge of the depletion layer at breakdown before rising up to substrate levels. In other embodiments, other doping profiles may be used. In one embodiment, an n-type buried layer implant can be incorporated using an additional mask at the interface between the substrate and the un-doped epilayer to further reduce the epi resistance without increasing Qgd.

As noted above with reference to exemplary embodiments thereof, the present invention provides a process for forming a short channel trench MOSFET. The method includes forming a first implant at the bottom of a trench that is formed in the body of the trench MOSFET and forming a second implant that is tilted in its orientation and directed perpendicular to the trench that is formed in the body of the trench MOSFET. The second implant is adjusted so that it does not reach the bottom of the trench.

Table 1 is a summary of performance differences between a standard G4 process and an exemplary short-channel trench MOSFET process in accordance with one embodiment of the present invention.

TABLE 1

Summary of performance differences between standard G4 process and short-channel trench MOSFET process.

| | G4_30V_287M_500A With red phosphorous | Short-Channel Trench MOSFET With Red Phosphorous | Difference |
|---|---|---|---|
| Trench Depth (um) | 0.95 | 0.6 | |
| Rds1 (mohm · cm2) | 0.108 | 0.136 | +26% |
| Rds2 (mohm · cm2) | 0.150 | 0.168 | +12% |
| BV (V) | 35.5 | 35.8 | +1% |
| Vth1 (V) | 2.48 | 2.44 | −2% |
| Qg5V (nC/cm2) | 589 | 395 | −33% |
| Qgs (nC/cm2) | 175 | 115 | −34% |
| Qgd (nC/m2) | 180 | 120 | −33% |
| Rds2*Qgd (mohm · nC) | 27.0 | 20.2 | −25% |
| Rds2*Qg5V (mohm · nc) | 88.4 | 66.4 | −25% |
| Cgs 15V (F/um) | 4.84e−16 | 3.44e−16 | −29% |
| Cgd 15V (F/um) | 4.04e−17 | 1.97e−17 | −51% |

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A short-channel trench MOSFET, comprising;
   a substrate;
   a trench formed in said substrate;
   a first implant formed at a bottom of said trench; and
   a second implant formed in said substrate that is tilted in orientation and adjusted to not reach said bottom of said trench.

2. The short-channel trench MOSFET of claim 1 wherein said first implant is self-aligned to said trench bottom and defines a channel bottom.

3. The short-channel trench MOSFET of claim 1 wherein said second implant is an anti-pinching implant.

4. The short-channel trench MOSFET of claim 1 wherein said trench has a depth that determines a channel length.

5. The short-channel trench MOSFET of claim 1 wherein said second implant is formed prior to the formation of contact and contact-clamping implants.

6. The short-channel trench MOSFET of claim 1 wherein said second implant is formed at two twist angles.

7. The short-channel trench MOSFET of claim 1 wherein said first implant comprises an n-type dopant.

8. The short-channel trench MOSFET of claim 2 wherein said second implant comprises an n-type dopant.

9. A trench MOSFET, comprising;
a substrate;
a trench formed in said substrate;
a first implant formed at a bottom of said trench; and
a second implant formed in said substrate that is tilted in orientation, having a serpentine shape, and adjusted to not reach said bottom of said trench.

10. The trench MOSFET of claim 9 wherein said first implant is self-aligned to said trench bottom and defines a channel bottom.

11. The trench MOSFET of claim 9 wherein said second implant is an anti-pinching implant.

12. The trench MOSFET of claim 9 wherein said trench has a depth that determines a channel length.

13. The trench MOSFET of claim 9 wherein said second implant is formed prior to the formation of contact and contact-clamping implants.

14. The trench MOSFET of claim 9 wherein said second implant is formed at two twist angles.

15. The trench MOSFET of claim 9 wherein said first implant comprises an n-type dopant.

16. The trench MOSFET of claim 10 wherein said second implant comprises an n-type dopant.

17. A short channel trench MOSFET, comprising;
a substrate;
a trench formed in said substrate;
a first implant formed at a bottom of said trench; and
a second implant formed in said substrate via angled implantation, wherein said second implant has a doping profile reflecting said angled implantation, and adjusted to not reach said bottom of said trench,
wherein said second implant is configured to prevent pinch-off of said short channel.

18. The short channel trench MOSFET of claim 17, wherein bottom of said trench defines a bottom of the MOSFET channel.

19. The short channel trench MOSFET of claim 17, wherein said second implant is configured to confine p-type regions formed by a contact implant and a contact-clamping implant such that said contact implant and said contact-clamping implant remain above the bottom of said trench.

20. The short channel trench MOSFET of claim claim 17, wherein said second implant is configured to be implanted at an angle through a contact window.

* * * * *